United States Patent
Lee et al.

(10) Patent No.: US 9,754,975 B2
(45) Date of Patent: Sep. 5, 2017

(54) FLEXIBLE DISPLAY DEVICE

(71) Applicant: SAMSUNG DISPLAY CO., LTD., Yongin, Gyeonggi-do (KR)

(72) Inventors: Seung-Chan Lee, Yongin (KR); Jong-Ho Hong, Yongin (KR); Jong-In Baek, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 73 days.

(21) Appl. No.: 14/258,866

(22) Filed: Apr. 22, 2014

(65) Prior Publication Data
US 2015/0053965 A1    Feb. 26, 2015

(30) Foreign Application Priority Data
Aug. 23, 2013 (KR) .......................... 10-2013-0100190

(51) Int. Cl.
*H01L 27/12* (2006.01)

(52) U.S. Cl.
CPC ........ *H01L 27/124* (2013.01); *H01L 27/1218* (2013.01); *H01L 27/1225* (2013.01)

(58) Field of Classification Search
CPC ............... H01L 27/124; H01L 27/1225; H01L 27/1222; H01L 27/1218; H01L 27/326; H01L 51/5209; H01L 51/52; H01L 51/5206; H01L 27/3258; H01L 27/327; H01L 51/5203; H01L 21/28; H01L 51/5265; G09G 3/006; G09G 3/3208

USPC ......... 257/43, 72; 345/205, 82; 438/599, 29; 313/504; 324/762.07

See application file for complete search history.

(56) References Cited

U.S. PATENT DOCUMENTS

| 7,579,218 B2 | 8/2009 | Popovich | |
|---|---|---|---|
| 2007/0001711 A1* | 1/2007 | Kwak | G09G 3/006 324/762.07 |
| 2008/0191613 A1* | 8/2008 | Goh | H01L 27/1214 313/504 |
| 2010/0109981 A1* | 5/2010 | Bhattacharya | G09G 3/2088 345/55 |

FOREIGN PATENT DOCUMENTS

| JP | 05-072978 | 3/1993 |
|---|---|---|
| KR | 10-2012-0071962 | 7/2012 |

* cited by examiner

*Primary Examiner* — David Vu
*Assistant Examiner* — Mouloucoulaye Inoussa
(74) *Attorney, Agent, or Firm* — F. Chau & Associates, LLC

(57) ABSTRACT

A display device includes a plurality of first direction pixel lines. Each of the first direction pixel lines includes a plurality of pixels. Each of the plurality of first direction pixel lines is extended in a first direction. The plurality of first direction pixel lines are spaced apart from each other. A plurality of second direction conductive lines intersects the plurality of first direction pixel lines. The plurality of second direction conductive lines is connected to the first direction pixel lines. The plurality of second direction conductive lines transmits a scan signal.

12 Claims, 9 Drawing Sheets

FLEXIBLE DISPLAY DEVICE

CROSS-REFERENCE TO RELATED APPLICATION

This application claims priority to and the benefit of Korean Patent Application No. 10-2013-0100190 filed in the Korean Intellectual Property Office on Aug. 23, 2013, the entire contents of which are incorporated by reference herein.

TECHNICAL FIELD

The present invention relates to a display device, and more particularly, to a flexible display device.

DISCUSSION OF THE RELATED ART

Flat-panel display devices have become fairly common in today's electronic devices. Examples of flat-panel display devices include liquid crystal display (LCD) devices and organic light emitting diode (OLED) devices. While flat-panel display devices have generally been rigid, some flat-panel display devices are constructed on flexible substrates, which may open the door to many uses not previously possible with rigid display devices.

Flexible display devices may be formed by forming display elements, such as light emitting elements, on top of a flexible substrate. Different configurations may have different abilities to flex and this ability to flex may be represented in terms of a tension limitation. A given flexible display may be safely bent up until its tension limitation, which may be, for example, about 20% for a display that may have a curvature radius of about 1 mm.

The flexible substrate may include a polymer of a polyimide-based material as a main element thereof. However, when using such a material, it may be difficult to obtain and optimize an ideal chemical composition for the substrate.

Polydimethylsiloxane (PDMS) has been used as a material for forming flexible substrates. PDMS may be physically restored to its original shape after flexing and may have a tension limitation of more than 20%. However, while PDMS has an excellent physical restoration property, its thermal stability may be suboptimal compared with a polyimide-based material, Poor thermal stability may limit the use of high temperature processing, which may tend to be particularly efficient.

To resolve this problem, the flexibility of a substrate may increased by forming one or more through holes, for example, having a quadrangle or polygon shape. However, cracks and breaks may be generated at the edge of the through hole such that the strength of the substrate may be very weak.

SUMMARY OF THE INVENTION

The present invention provides a display device with increased flexibility.

A display device according to an exemplary embodiment of the present invention includes a plurality of first direction pixel lines including a plurality of pixels disposed in a first direction and disposed separated from each other. A plurality of second direction conductive lines intersects the first direction pixel lines, connects to the first direction pixel lines, and transmits a scan signal.

First direction assistance lines may be disposed between adjacent first direction pixel lines and second direction assistance lines may intersect the first direction assistance line and may be formed between adjacent second direction conductive lines. The first direction assistance lines and the second direction assistance lines may intersect each other thereby forming a plain weave pattern.

The first direction may be a vertical direction, the second direction may be a horizontal direction, and the second direction conductive line may be a horizontal direction conductive line transmitting a scan signal.

The first direction pixel line may include a substrate line extending in the first direction, a scan line extending in the second direction on the substrate line, a data line intersecting the scan line and extending in the first direction, a switch connected to the scan line and the data line, a pixel electrode connected to the switch, and an external connection member connecting the scan line and the second direction conductive line to each other.

The scan line may have respective ends, and the respective ends of the scan line may be connected to the external connection member through the second direction conductive line.

The first direction may be a horizontal direction, the second direction may be a vertical direction, and the second direction conductive line may be a vertical direction conductive line transmitting a data signal.

The first direction pixel line may include a substrate line extending in the first direction, a scan line extending in the first direction on the substrate line, a data line intersecting the scan line and extending in the second direction, a pixel electrode connected to the scan line and the data line, and an external connection member connecting the data line and the second direction conductive line to each other.

The data line may have respective ends, and the respective ends of the data line may be connected to the external connection member through the second direction conductive line.

According to an exemplary embodiment of the present invention, by forming a plurality of first direction pixel lines by the cutting in the vertical direction to have flexibility, the scan signal is transmitted to a plurality of first direction pixel lines extending in the vertical direction through the second direction conductive lines extending in the horizontal direction, thereby manufacturing a display device having high flexibility.

Also, by forming a plurality of first direction pixel lines through the cutting in the horizontal direction to have flexibility, the data signal is transmitted to a plurality of first direction pixel lines extending in the horizontal direction through the second direction conductive lines extending in the vertical direction, thereby manufacturing a display device having high flexibility.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
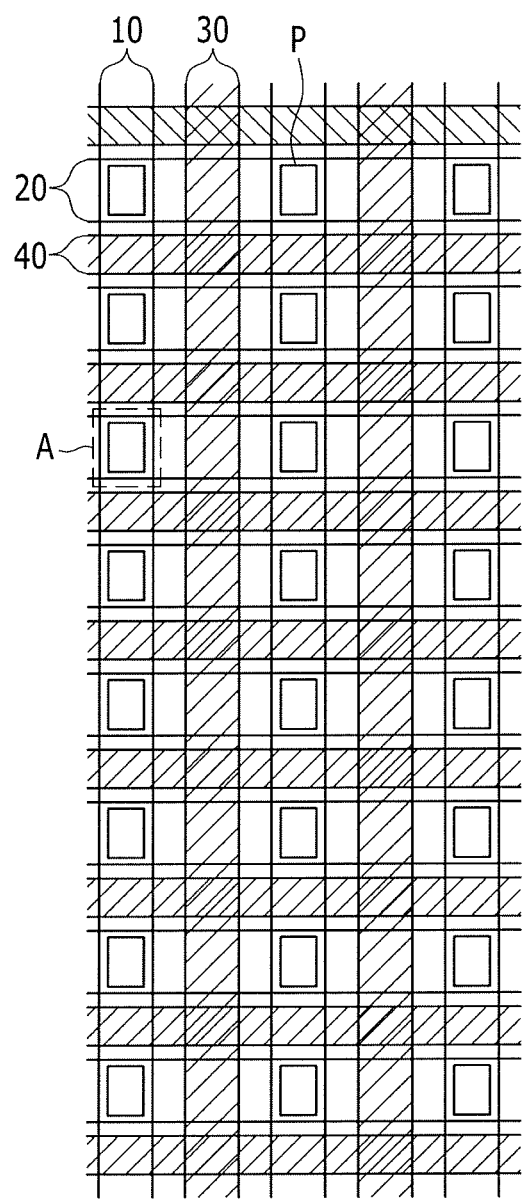
FIG. 1 is a top plan view of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals may designate like elements throughout the specification.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Now, a display device according to an exemplary embodiment of the present invention will be described with reference to FIG. 1 to FIG. 4.

Figure 2:
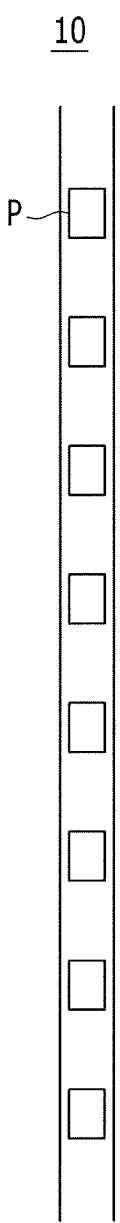
FIG. 2 is a top plan view of one vertical direction pixel line in a display device according to an exemplary embodiment of the present invention.

FIG. 1 is a top plan view of a display device according to an exemplary embodiment of the present invention, and FIG. 2 is a top plan view of one vertical direction pixel line in a display device according to an exemplary embodiment of the present invention.

As shown in FIG. 1 and FIG. 2, a display device according to an exemplary embodiment of the present invention includes a plurality of first direction pixel lines 10 with which a plurality of pixels P are disposed in a vertical direction which is a first direction and a plurality of second direction conductive lines 20 intersecting the first direction pixel lines 10. The first direction pixel lines 10 are vertical direction pixel lines and the second direction corresponds to the horizontal direction such that the second direction conductive lines 20 are horizontal direction conductive lines.

The plurality of first direction pixel lines 10 are disposed to be separated from each other, and the second direction conductive lines 20 are connected to the first direction pixel lines 10 and transmit a scan signal.

Also, first direction assistance lines 30 are disposed between adjacent first direction pixel lines 10, and second direction assistance lines 40 intersect the first direction assistance lines 30 and are formed between adjacent second direction conductive lines 20.

Here, the first direction assistance lines 30 and the second direction assistance lines 40 intersect each other thereby forming a plain weave. For example, the first direction assistance lines 30 and the second direction assistance lines 40 respectively correspond to a warp and a weft, and are interwoven with each other thereby forming the plain weave. Accordingly, a force supporting the first direction pixel line 10 and the second direction conductive line 20 is provided.

Figure 3:
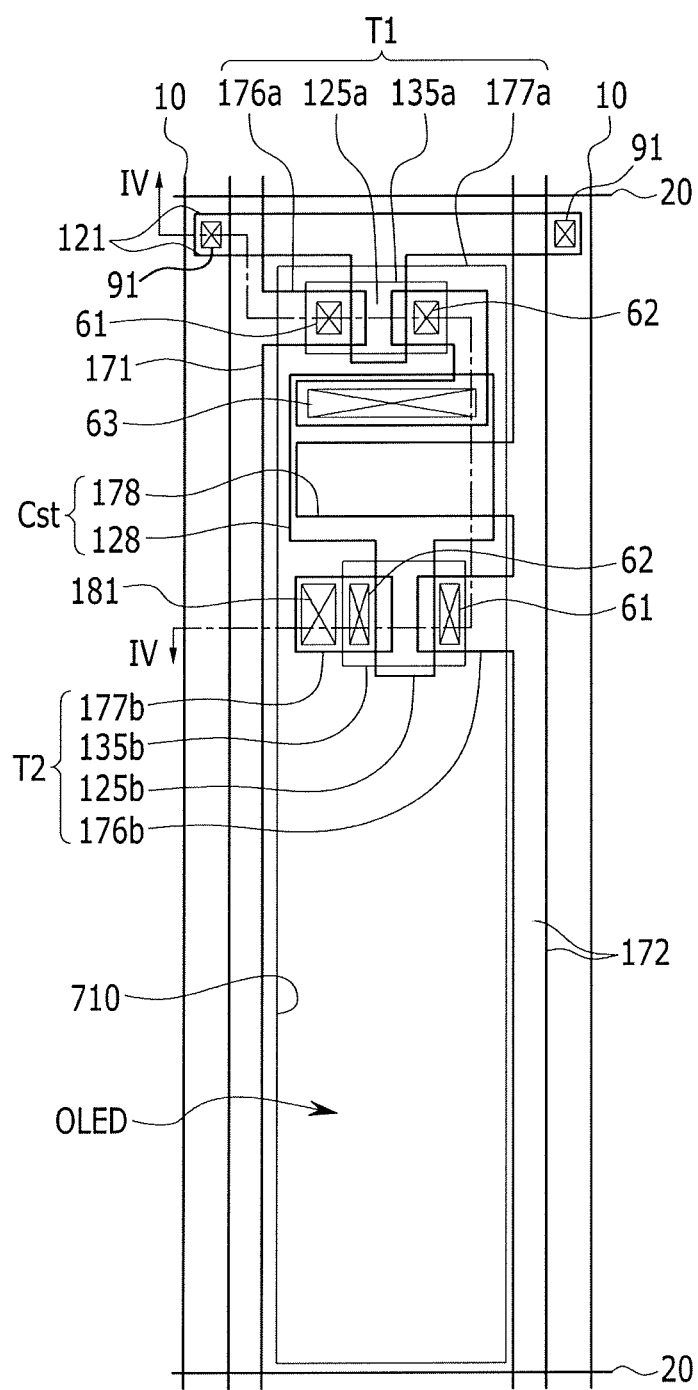
FIG. 3 is an enlarged layout view of a portion A of FIG. 1.
Figure 4A:
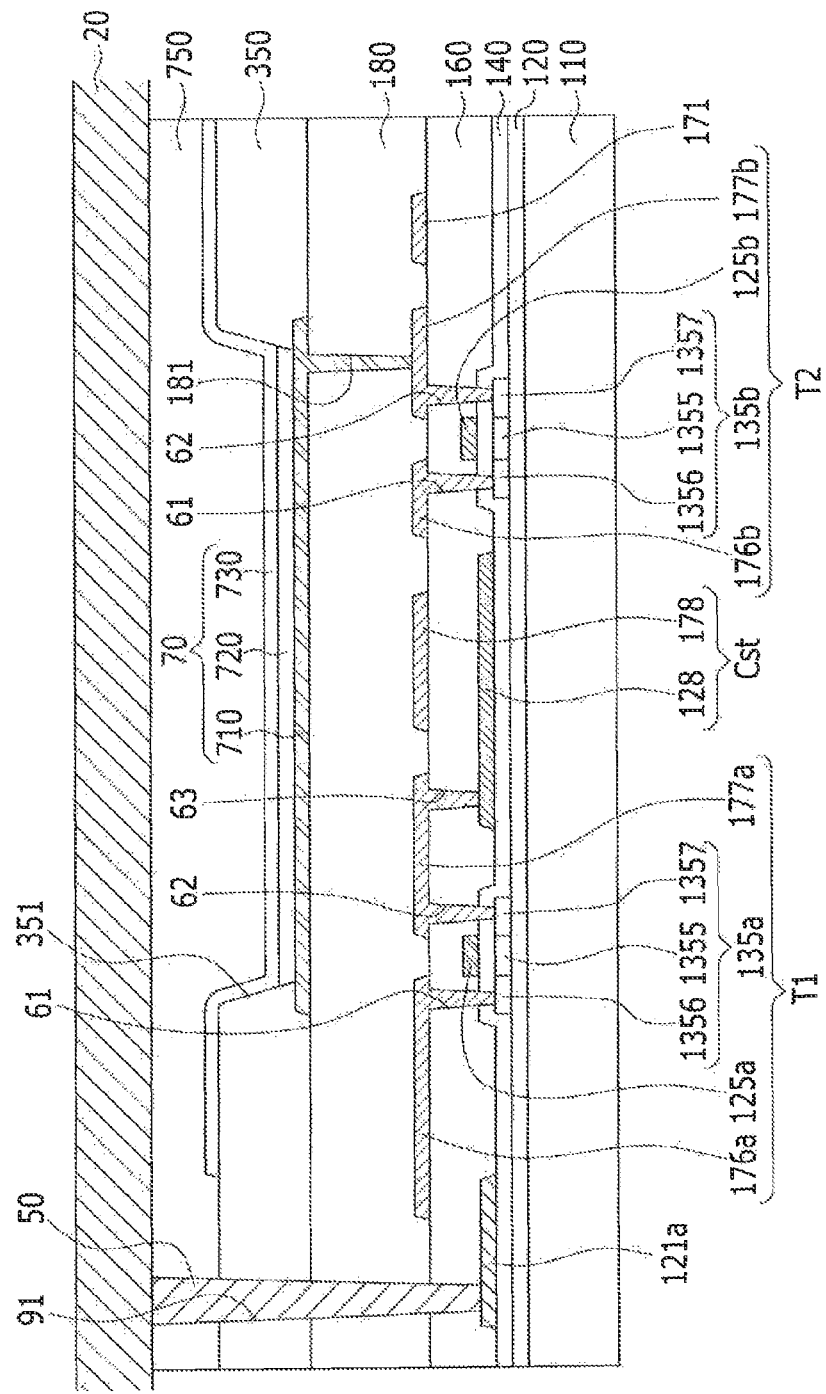
FIG. 4A is a cross-sectional view taken along the line IVA-IVA of FIG. 3.
Figure 4B:
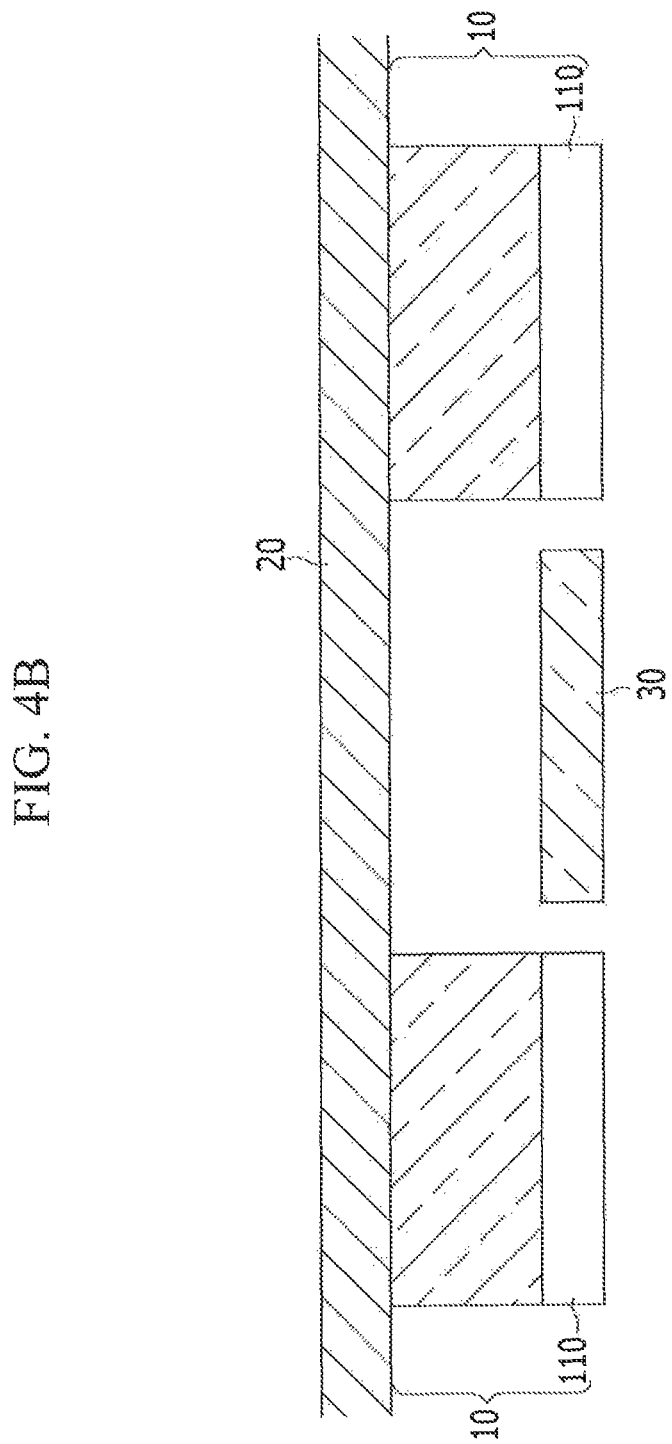
FIG. 4B is a cross-sectional view taken along the line IVB-IVB of FIG. 1.

A detailed structure of the first direction pixel line will be described with reference to FIG. 3, FIG. 4A, and FIG. 4B. FIG. 3, FIG. 4A, and FIG. 4B show an organic light emitting diode (OLED) display as an exemplary embodiment of the present invention, however the invention is not limited thereto, and a flat panel display such as a liquid crystal display (LCD) or a plasma display panel (PDP) may be used.

FIG. 3 is an enlarged layout view of a portion A of FIG. 1, FIG. 4A is a cross-sectional view taken along the line IVA-IVA of FIG. 3, and FIG. 4B is a cross-sectional view taken along the line IVB-IVB of FIG. 1.

As shown in FIG. 3, FIG. 4A and FIG. 4B, the first direction pixel line 10 of the display device according to an exemplary embodiment of the present invention includes a substrate line 110 extending in the vertical direction being the first direction. The substrate line 110 extends in the first direction and may be an insulating and flexible substrate made of glass, quartz, ceramic, or plastic. The substrate lines 110 may be formed by cutting a quadrangular substrate in the first direction.

A buffer layer 120 is formed on one substrate line 110. The buffer layer 120 may have a single-layer structure of a silicon nitride (SiNx), or a dual-layer structure of a silicon nitride (SiNx) and a silicon oxide ($SiO_x$) laminated to each other. The buffer layer 120 prevents penetration of contaminating elements, such as impurities or moisture, and helps planarize the surface.

A switching semiconductor layer 135a and a driving semiconductor layer 135b are formed on the buffer layer 120, being spaced apart from each other. These semiconductor layers 135a and 135b may be made of a polysilicon or oxide semiconductor. The oxide semiconductor may contain oxides based on titanium (Ti), hafnium (Hf), zirconium (Zr), aluminum (Al), tantalum (Ta), germanium (Ge), zinc (Zn), gallium (Ga), tin (Sn), or indium (In), or complex oxides thereof, such as zinc oxide (ZnO), indium-gallium-zinc oxide (InGaZnO4), indium-zinc-oxide (Zn—In—O), zinc-tin-oxide (Zn—Sn—O), indium-gallium-oxide (In—Ga—O), indium-tin-oxide (In—Sn—O), indium-zirconium-oxide (In—Zr—O), indium-zirconium-zinc-oxide (In—Zr—Zn—O), indium-zirconium-tin-oxide (In—Zr—Sn—O), indium-zirconium-gallium-oxide (In—Zr—Ga—O), indium-aluminum-oxide (In—Al—O), indium-zinc-aluminum-oxide (In—Zn—Al—O), indium-tin-aluminum-oxide (In—Sn—Al—O), indium-aluminum-gallium-oxide (In—Al—Ga—O), indium-tantalum-oxide (In—Ta—O), indium-tantalum-zinc-oxide (In—Ta—Zn—O), indium-tantalum-tin-oxide (In—Ta—Sn—O), indium-tantalum-gallium-oxide (In—Ta—Ga—O), indium-germanium-oxide (In—Ge—O), indium-germanium-zinc-oxide (In—Ge—Zn—O), indium-germanium-tin-oxide (In—Ge—Sn—O), indium-germanium-gallium-oxide (In—Ge—Ga—O), titanium-indium-zinc-oxide (Ti—In—Zn—O), or hafnium-indium-zinc-oxide (Hf—In—Zn—O). If the semiconductor layers 135a and 135b are made of the oxide semiconductor, a separate protective layer may be added to protect the oxide semiconductor from the outside environment such as from a high temperature.

The semiconductor layers 135a and 135b each include a channel region not doped with impurities and source and drain regions doped with impurities and formed at respective sides of the channel region. The impurities vary according to the type of thin film transistors, and may be N-type impurities or P-type impurities.

The switching semiconductor layer 135a and the driving semiconductor layer 135b each are divided into a channel region 1355 and a source region 1356 and drain region 1357 formed at respective sides of the channel region 1355. The channel regions 1355 of the switching semiconductor layer 135a and the driving semiconductor layer 135b may include polysilicon not doped with impurities, for example, an intrinsic semiconductor. The source regions 1356 and drain regions 1357 of the switching semiconductor layer 135a and the driving semiconductor layer 135b may include polysilicon doped with conductive impurities, for example, an impurity semiconductor.

A gate insulating layer 140 is formed on the switching semiconductor layer 135a and the driving semiconductor layer 135b. The gate insulating layer 140 may include a single layer or a plurality of layers containing a silicon nitride or a silicon oxide.

A scan line 121, a driving gate electrode 125b, and a first storage capacitor plate 128 are formed on the gate insulating layer 140. The scan line 121 extends in the horizontal direction and has respective ends 121a. For example, the substrate line 10 is elongated in the vertical direction such that the scan line 121 is formed short in the horizontal direction and has respective ends 121a. The scan line 121 receives the scan signal from the second direction conductive line 20 to transmit the scan signal, and the scan line 121 includes a switching gate electrode 125a protruded from the scan line 121 to the switching semiconductor layer 135a. The driving gate electrode 125b protrudes from the first storage capacitor plate 128 toward the driving semiconductor layer 135b. The switching gate electrode 125a and the driving gate electrode 125b overlap the channel regions 1355, respectively.

An interlayer insulating layer 160 is formed on the scan line 121, the driving gate electrode 125b, and the first storage capacitor plate 128. Like the gate insulating layer 140, the interlayer insulating layer 160 may be formed of a silicon nitride or silicon oxide.

Source contact holes 61 and drain contact holes 62 are formed in the interlayer insulating layer 160 and the gate insulating layer 140 to expose the source regions 1356 and the drain regions 1357. Storage contact holes 63 are formed therein to expose part of the first storage capacitor plate 128.

A data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128 are formed on the interlayer insulating layer 160.

The data line 171 transfers a data signal, and extends in a direction crossing the scan line 121. The driving voltage line 172 transfers a driving voltage, and is separated from the data line 171 and extends in the same direction as the data line 171.

The switching source electrode 176a protrudes from the data line 171 toward the switching semiconductor layer 135a, and the driving source electrode 176b protrudes from the driving voltage line 172 toward the driving semiconductor layer 135b. The switching source electrode 176a and the source electrode 176b are respectively connected to the source regions 1356 through the source contact holes 61. The switching drain electrode 177a faces the switching source electrode 176a, the driving drain electrode 177b faces the driving source electrode 176b, and the switching drain electrode 177a and the driving drain electrode 177b are respectively connected to the drain regions 1357 through the drain contact holes 62.

The switching drain electrode 177a is extended and electrically connected to the first storage capacitor plate 128 and the driving gate electrode 125b through the storage contact holes 63 formed in the interlayer insulating layer 160.

The second storage capacitor plate 178 protrudes from the driving voltage line 171, and overlaps the first storage capacitor plate 128. Accordingly, the first storage capacitor plate 128 and the second storage capacitor plate 178 constitute the storage capacitor Cst by using the interlayer insulating layer 160 as a dielectric material.

The switching semiconductor layer 135a, the switching gate electrode 125a, the switching source electrode 176a, and the switching drain electrode 177a constitute the switching thin film transistor T1, and the driving semiconductor layer 135b, the driving gate electrode 125a, the driving source electrode 176b, and the driving drain electrode 177b constitute the driving thin film transistor T2. The switching thin film transistor T1 and the driving thin film transistor T2 correspond to a switch.

A protective film 180 is formed on the switching source electrode 176a, the driving source electrode 176b, the switching drain electrode 177a, and the driving drain electrode 177b.

A pixel electrode 710 is formed on the protective layer 180, and the pixel electrode 710 may include a transparent conducting material such as ITO (indium tin oxide), IZO (indium zinc oxide), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically connected to the driving drain electrode 177b of the driving thin film transistor T2 through a contact hole 181 formed in the interlayer insulating layer 160, and serves as an anode of an organic light emitting diode 70.

A pixel defining layer 350 is formed on edge portions of the pixel electrode 710 and the protective film 180. The pixel defining layer 350 has an opening 351 exposing the pixel electrode 710. The pixel defining layer 350 may be made of a resin such as polyacrylate resin or polyimide resin, a silica-based inorganic material, or the like.

An organic emission layer 720 is formed in the opening 351 of the pixel defining layer 350. The organic emission layer 720 is formed as a plurality of layers including one or more of an emission layer (EL), a hole-injection layer (HIL), a hole-transporting layer (HTL), an electron-transporting layer (ETL), and/or an electron-injection layer (EIL). If the organic emission layer 720 includes all of them, the hole-injection layer may be positioned on the pixel electrode 710 serving as an anode, and the hole-transporting layer, the emission layer, the electron-transporting layer, and the electron-injection layer may be sequentially laminated on the pixel electrode 710.

The organic emission layer 720 may include a red organic emission layer for emitting red light, a green organic emission layer for emitting green light, and a blue organic emission layer for emitting blue light, and the red organic emission layer, the green organic emission layer, and the blue organic emission layer are respectively formed in red, green, and blue pixels, thereby displaying a color image.

Moreover, the red organic emission layer, green organic emission layer, and blue organic emission layer of the organic emission layer 720 may be respectively laminated on the red pixel, green pixel, and blue pixel, and a red color filter, a green color filter, and a blue color filter may be formed for the respective pixels, thereby displaying a color image. According to an example, a white organic emission layer for emitting white light may be formed on each of the red, green, and blue pixels, and a red color filter, a green color filter, and a blue color filter may be formed for the respective pixels, thereby displaying a color image. If the white organic emission layer and the color filters are used to display a color image, there may be no need to use a deposition mask for depositing the red, green, and blue organic emission layers on the respective pixels, e.g., the red, green, and blue pixels.

The white organic emission layer described in this example may be formed as one organic emission layer or a plurality of organic emission layers that are laminated to emit white light. For example, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

A common electrode 730 is formed on the pixel defining layer 350 and the organic emission layer 720. The common electrode 730 may be made of a transparent conducting material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 serves as a cathode of the organic light emitting diode 70. The pixel electrode 710, the organic emission layer 720, and the common electrode 730 constitute the organic light emitting diode (OLED) 70.

A cover 750 protecting the organic light emitting diode (OLED) 70 is formed on the common electrode 730. The cover 750, the pixel definition layer 350, the protective layer 180, and the interlayer insulating layer 160 have an external contact hole 91 exposing both ends 121a of the scan line 121, and an external connection member 50 is inserted into the external contact hole 91.

A second direction conductive line 20 extending in the horizontal direction is disposed on the cover 750 of the first direction pixel line 10 extending in the vertical direction. The second direction conductive line 20 contacts the external connection member 50 formed at the first direction pixel line 10 thereby being connected to the scan line 121 of the first direction pixel line 10. Accordingly, the scan signal transmitted through the second direction conductive line 20 is transmitted to the scan line 121 of a plurality of first direction pixel lines 10.

By forming a plurality of first direction pixel lines 10 through the cutting in the vertical direction to have flexibility and by transmitting the scan signal through the second direction conductive lines 20 extending in the transverse direction to a plurality of first direction pixel lines 10 extending in the vertical direction, a display device having high flexibility may be manufactured.

A plurality of first direction pixel lines extending in the vertical direction may be formed, however alternatively, a plurality of first direction pixel lines extending in the horizontal direction may be formed.

Next, referring to FIG. 5 to FIG. 8, a display device according to an exemplary embodiment of the present invention will be described.

Figure 5:
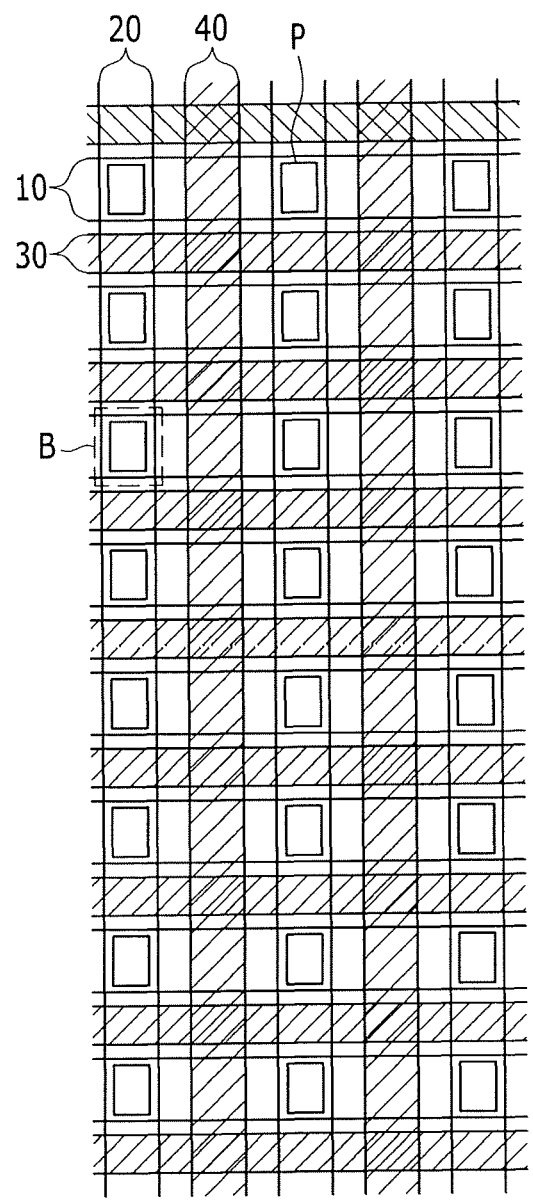
FIG. 5 is a top plan view of a display device according to an exemplary embodiment of the present invention.
Figure 6:
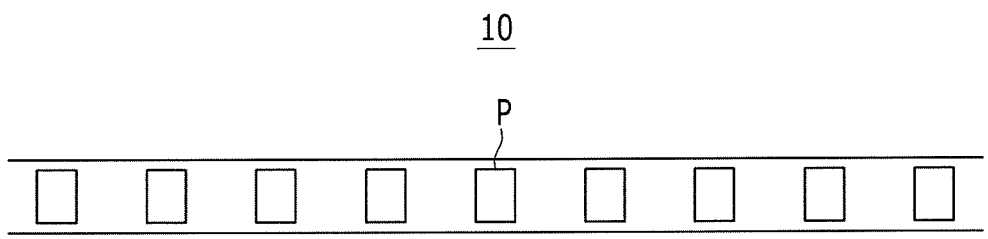
FIG. 6 is a top plan view of one horizontal direction pixel line in a display device according to an exemplary embodiment of the present invention.
Figure 7:
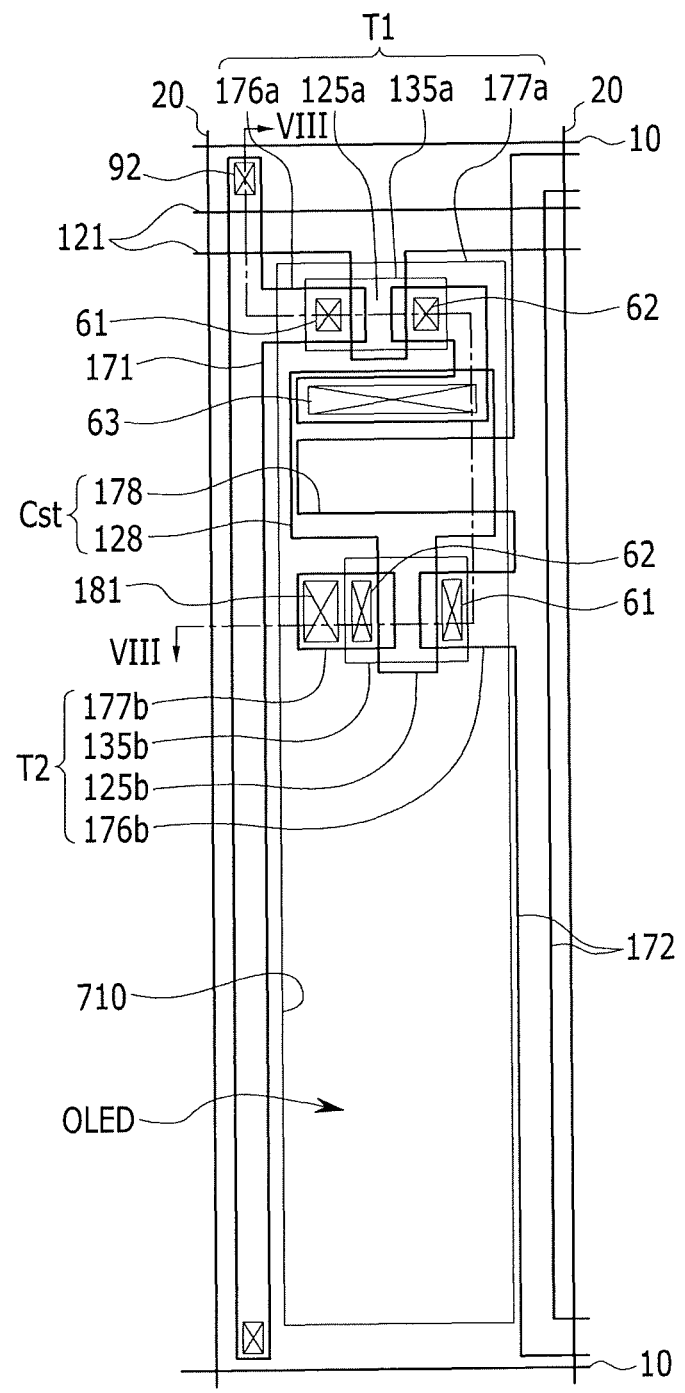
FIG. 7 is an enlarged layout view of a portion B of FIG. 5.
Figure 8:
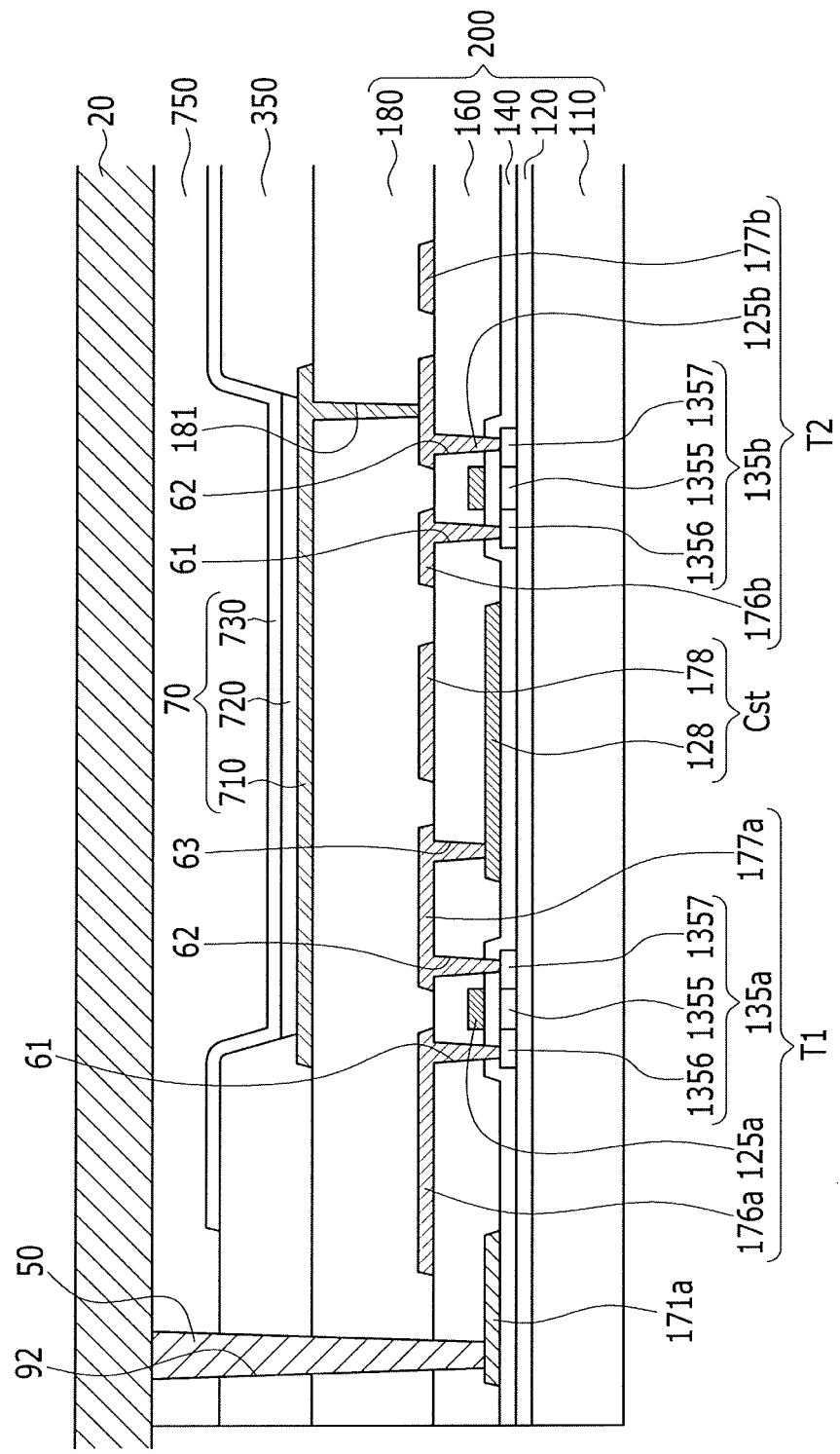
FIG. 8 is a cross-sectional view taken along the line VIII-VIII of FIG. 7.

FIG. 5 is a top plan view of a display device according to an exemplary embodiment of the present invention. FIG. 6 is a top plan view of one horizontal direction pixel line in a display device according to an exemplary embodiment of the present invention. FIG. 7 is an enlarged layout view of a portion B of FIG. 5. FIG. 8 is a cross-sectional view taken along the line VIII-VIII of FIG. 7.

The configuration illustrated in FIGS. 5-7 may be substantially equivalent to the configuration shown in FIG. 1 to FIG. 4 except for an elongation direction of the first direction pixel line.

As shown in FIG. 5 to FIG. 8, the display device according to an exemplary embodiment of the present invention includes a plurality of first direction pixel lines 10 with which a plurality of pixels P are disposed in the horizontal direction which is first direction and a plurality of second direction conductive lines 20 intersecting the first direction pixel lines 10. The first direction pixel lines 10 are horizontal direction pixel lines and the second direction corresponds to the vertical direction such that the second direction conductive lines 20 are vertical direction conductive lines.

The plurality of first direction pixel lines 10 are disposed to be separated from each other, and the second direction conductive lines 20 are connected to the first direction pixel lines 10 and transmit the scan signal.

Also, the first direction assistance lines 30 are disposed between the adjacent first direction pixel lines 10, and the second direction assistance lines 40 intersect the first direction assistance lines 30 and are formed between adjacent second direction conductive lines 20. Here, the first direction assistance line 30 and the second direction assistance line 40 intersect each other thereby forming a plain weave. For example, the first direction assistance line 30 and the second direction assistance line 40 respectively correspond to the warp and the weft and are interwoven with each other thereby forming the plain weave. Accordingly, the force supporting the first direction pixel line 10 and the second direction conductive line 20 is provided.

The first direction pixel line 10 includes a substrate line 110 extending in the horizontal direction of the first direction. A buffer layer 120 is formed on one substrate line 110. A switching semiconductor layer 135a and a driving semiconductor layer 135b are formed on the buffer layer 120, being spaced apart from each other. The switching semiconductor layer 135a and the driving semiconductor layer 135b are each divided into a channel region 1355 and a source region 1356 and drain region 1357 formed at respective sides of the channel region 1355. A gate insulating layer 140 is formed on the switching semiconductor layer 135a and the driving semiconductor layer 135b.

A scan line 121, a driving gate electrode 125b, and a first storage capacitor plate 128 are formed on the gate insulating layer 140. The scan line 121 extends in the horizontal direction and includes a switching gate electrode 125a protruding from the scan line 121 to the switching semiconductor layer 135a. A driving gate electrode 125b protrudes from the first storage capacitor plate 128 toward the driving semiconductor layer 135b. An interlayer insulating layer 160 is formed on the scan line 121, the driving gate electrode 125b, and the first storage capacitor plate 128. Source contact holes 61 and drain contact holes 62 are formed in the interlayer insulating layer 160 and the gate insulating layer 140 to expose the source regions 1356 and the drain regions 1357, and storage contact holes 63 are formed therein to expose part of the first storage capacitor 128.

A data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128 are formed on the interlayer insulating layer 160.

The data line 171 transmits the data signal and extends in the direction intersecting the scan line 121, and the data line 171 has respective ends 171a. For example, the substrate line 10 is elongated in the horizontal direction such that the data line 171 is formed short in the vertical direction and has the respective ends 171a. The data line 171 receives the data signal from the second direction conductive line 20 and again transmits it to the pixel electrode 710. The driving voltage line 172 transfers a driving voltage, and is separated from the data line 171 and extends in the same direction as the data line 171.

The switching drain electrode 177a is extended and electrically connected to the first storage capacitor plate 128 and the driving gate electrode 125b through the storage contact holes 63 formed in the interlayer insulating layer 160.

The second storage capacitor plate 178 protrudes from the driving voltage line 171, and overlaps the first storage capacitor plate 128. Accordingly, the first storage capacitor plate 128 and the second storage capacitor plate 178 constitute the storage capacitor Cst by using the interlayer insulating layer 160 as a dielectric material.

The switching semiconductor layer 135a, the switching gate electrode 125a, the switching source electrode 176a, and the switching drain electrode 177a constitute the switching thin film transistor T1, and the driving semiconductor layer 135b, the driving gate electrode 125a, the driving source electrode 176b, and the driving drain electrode 177b constitute the driving thin film transistor T2. The switching thin film transistor T1 and the driving thin film transistor T2 correspond to a switch.

A protective film 180 is formed on the switching source electrode 176a, the driving source electrode 176b, the switching drain electrode 177a, and the driving drain electrode 177b.

A pixel electrode 710 is formed on the protective layer 180, and the pixel electrode 710 is electrically connected to the driving drain electrode 177b of the driving thin film transistor T2 through the contact hole 181 formed in the interlayer insulating layer 160 thereby serving as the anode of the organic light emitting diode (OLED) 70.

A pixel defining layer 350 is formed on edge portions of the pixel electrode 710 and the protective film 180. The pixel defining layer 350 has an opening 351 exposing the pixel electrode 710. An organic emission layer 720 is formed in the opening 351 of the pixel defining layer 350. A common electrode 730 is formed on the pixel defining layer 350 and the organic emission layer 720. The common electrode 730 serves as a cathode of the organic light emitting diode 70. The pixel electrode 710, the organic emission layer 720, and the common electrode 730 constitute the organic light emitting diode (OLED) 70.

A cover 750 protecting the organic light emitting diode (OLED) 70 is formed on the common electrode 730. The cover 750, the pixel definition layer 350, and the protective layer 180 have an external contact hole 92 exposing both ends 171a of the data line 171 and an external connection member 50 is inserted into the external contact hole 92.

A second direction conductive line 20 extending in the vertical direction is disposed on the cover 750 of the first direction pixel line 10 extending in the horizontal direction. The second direction conductive line 20 contacts the external connection member 50 formed at the first direction pixel line 10 thereby being connected to the data line 171 of the first direction pixel line 10. Accordingly, the data signal transmitted through the second direction conductive line 20 is transmitted to the data line 171 of a plurality of first direction pixel lines 10.

As described, by forming a plurality of first direction pixel lines 10 through the cutting of the horizontal direction to increase flexibility and by transmitting the data signal through the second direction conductive line 20 extending in the vertical direction to a plurality of first direction pixel lines 10 extending in the horizontal direction, a display device having high flexibility may be manufactured.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure.

What is claimed is:

1. A display device comprising:
    a plurality of first direction pixel lines, each of which includes a plurality of pixels disposed therein, and each of the plurality of first direction pixel lines extending in a first direction, wherein the plurality of first direction pixel lines are spaced apart from each other with an empty space between each of the pixel lines of the plurality of first direction pixel lines;
    a plurality of second direction conductive lines intersecting the plurality of first direction pixel lines, the plurality of second direction conductive lines connected to the first direction pixel lines, and transmitting a scan signal;
    a plurality of first direction assistance lines, each of which is disposed between adjacent first direction pixel lines of the plurality of first direction pixel lines; and
    a plurality of second direction assistance lines, each of which is intersecting the plurality of first direction assistance lines, the plurality of second direction assistance lines formed between adjacent second direction conductive lines of the plurality of second direction conductive lines,
    wherein the plurality of first direction assistance lines and the plurality of second direction assistance lines are interwoven together as warp and weft, respectively, and
    wherein each of the plurality of first direction pixel lines includes a substrate line extending in the first direction.

2. The display device of claim 1, wherein the first direction is a vertical direction, the second direction is a horizontal direction, and the second direction conductive line is a conductive line extended horizontally and transmitting a scan signal.

3. The display device of claim 2, wherein, each of the plurality of first direction pixel lines further includes:
    a scan line extending in the second direction on the substrate line;
    a data line intersecting the scan line and extending in the first direction; a switch connected to the scan line and the data line;
    a pixel electrode connected to the switch; and
    an external connection member connecting the scan line and the second direction conductive line to each other.

4. The display device of claim 3, wherein the scan line has respective ends, and the respective ends of the scan line are connected to the external connection member through the second direction conductive line.

5. The display device of claim 1, wherein the first direction is a horizontal direction, the second direction is a vertical direction, and the second direction conductive line is a conductive line extending vertically and transmitting a data signal.

6. The display device of claim 5, wherein, each of the plurality of first direction pixel line includes:
a substrate line extending in the first direction;
a scan line extending in the first direction on the substrate line;
a data line intersecting the scan line and extending in the second direction;
a pixel electrode connected to the scan line and the data line; and
an external connection member connecting the data line and the second direction conductive line to each other.

7. The display device of claim 6, wherein the data line has respective ends, and the respective ends of the data line are connected to the external connection member through the second direction conductive line.

8. A flexible display device, comprising:
a plurality of pixel lines extending in a first direction, each of the plurality of pixel lines comprising a plurality of pixels disposed therein;
a first plurality of assistance lines extending in the first direction and interleaved with the plurality of pixel lines;
a plurality of conductive lines extending in a second direction perpendicular to the first direction; and
a second plurality of assistance lines extending in the second direction and interleaved with the plurality of conductive lines,
wherein the first plurality of assistance lines and the second plurality of assistance lines are interwoven together as warp and weft, respectively,
wherein each of the plurality of first direction pixel lines includes a substrate line extending in the first direction, and
wherein an empty space is between adjacent first direction pixel lines.

9. The flexible display of claim 8, wherein the plurality of conductive lines transmits a scan signal.

10. The flexible display of claim 8, wherein the first direction is a vertical direction and the second direction is a horizontal direction.

11. The flexible display of claim 8, wherein each of the plurality of pixel lines further includes:
a scan line extending in the second direction on the substrate line;
a data line intersecting the scan line and extending in the first direction;
a switch connected to the scan line and the data line;
a pixel electrode connected to the switch; and
an external connection member connecting the scan line and the plurality of conductive lines to each other.

12. The flexible display of claim 11, wherein the scan line has respective ends, and the respective ends of the scan line are connected to the external connection member through the plurality of conductive lines.

\* \* \* \* \*